(12) United States Patent
Seigneur

(10) Patent No.: US 10,707,364 B2
(45) Date of Patent: Jul. 7, 2020

(54) SOLAR CELL WITH ABSORBER SUBSTRATE BONDED BETWEEN SUBSTRATES

(71) Applicant: University of Central Florida Research Foundation, Inc., Orlando, FL (US)

(72) Inventor: Hubert Seigneur, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 237 days.

(21) Appl. No.: 14/725,685

(22) Filed: May 29, 2015

(65) Prior Publication Data

US 2015/0349165 A1  Dec. 3, 2015

Related U.S. Application Data

(60) Provisional application No. 62/005,307, filed on May 30, 2014.

(51) Int. Cl.
| | | |
|---|---|---|
| *H01L 31/074* | (2012.01) | |
| *H01L 31/18* | (2006.01) | |
| *H01L 31/0465* | (2014.01) | |
| *H01L 31/0224* | (2006.01) | |
| *H01L 31/048* | (2014.01) | |

(52) U.S. Cl.
CPC .. *H01L 31/0465* (2014.12); *H01L 31/022458* (2013.01); *H01L 31/0488* (2013.01); *H01L 31/074* (2013.01); *H01L 31/1804* (2013.01); *Y02E 10/547* (2013.01); *Y02P 70/521* (2015.11)

(58) Field of Classification Search
CPC ................ H01L 31/0747; H01L 31/022458
See application file for complete search history.

(56) References Cited

U.S. PATENT DOCUMENTS

| | | | |
|---|---|---|---|
| 5,935,344 A * | 8/1999 | Endo | H01L 31/202 136/255 |
| 6,187,448 B1 | 2/2001 | Hanoka et al. | |
| 8,268,699 B2 | 9/2012 | Park et al. | |
| 2004/0089338 A1* | 5/2004 | Kukulka | H01L 27/142 136/251 |

(Continued)

OTHER PUBLICATIONS

Zuzana Mrazkova, et al., "Optical properties and performance of pyramidal texture silicon heterojuction solar cells: Key role of vertex angles", Prog. Photolt. Res. Appl. 2018;1-8, wileyonlinelibrary.com/journal/ip. pp. 1-8.

(Continued)

*Primary Examiner* — Magali P Slawski
(74) *Attorney, Agent, or Firm* — Fleit Intellectual Property Law; Thomas S. Grzesik

(57) ABSTRACT

A solar cell includes a first processed optically transparent (transparent) substrate and a second processed transparent substrate, wherein at least one of the first processed transparent substrate and second processed transparent substrate includes at least one electrode thereon. At least one solar absorber material substrate having a first side and a second side is between the first and second processed transparent substrates. The solar absorber material substrate is bonded by an adhesiveless bonded interface on both the first side and the second side to the first and second processed transparent substrates.

11 Claims, 9 Drawing Sheets

(56) References Cited

U.S. PATENT DOCUMENTS

| | | | |
|---|---|---|---|
| 2005/0000561 A1* | 1/2005 | Baret | H01L 31/048 136/244 |
| 2007/0068571 A1* | 3/2007 | Li | H01L 31/075 136/258 |
| 2010/0237272 A1 | 9/2010 | Chaudhari | |
| 2011/0180133 A1 | 7/2011 | Verhaverbeke et al. | |
| 2011/0201177 A1* | 8/2011 | Fournel | H01L 21/76254 438/458 |
| 2011/0203650 A1* | 8/2011 | Furusawa | B82Y 20/00 136/255 |
| 2012/0204939 A1* | 8/2012 | Lee | H01L 31/0749 136/249 |
| 2013/0100675 A1* | 4/2013 | Han | H01L 27/301 362/253 |
| 2013/0102133 A1* | 4/2013 | Sheng | H01L 21/0257 438/478 |
| 2014/0000683 A1 | 1/2014 | Pretorius et al. | |
| 2014/0227825 A1* | 8/2014 | Chen | H01L 31/077 438/87 |
| 2015/0020877 A1* | 1/2015 | Moslehi | H01L 31/02244 136/256 |

OTHER PUBLICATIONS

Mario Moreno, et al., "Amorphous Polymorphous, and Microcrystaline Silicon Thin Films Deposited by Plama at Low Temperatures", chapter 8 from the book "Crystalline and Non-crystalline Solids" by Mario Moreno et al.

M.M.R. Howlader, et al., "Boid-free strong bonding of surface activated silicon wafers from room temperature to annealing at 600° C.", Thin Solid Films, 519, 2010, pp. 804-808.

Andreas Plóëüt, et al., "Water direct bonding: tailoring adhesion between brittle materials", Materials Science and Engineering, R25, 1999, pp. 1-88.

Dross, et. al., "Crystalline thin-foil silicon solar cells: where crystalline quality meets thin-film processing," Progress in Photovoltaics: Research and Applications, 2012, 15 pages, Wiley Online Library (wileyonlinelibrary.com).

Granata, et. al., "Plasma-silicone interaction during a-Si:H deposition on solar cell wafers bonded to glass," Solar Energy Materials & Solar Cells, 2014, pp. 48-54, vol. 124, Elsevier, www.elsevier.com/locate/solmat.

* cited by examiner

SOLAR CELL WITH ABSORBER SUBSTRATE BONDED BETWEEN SUBSTRATES

CROSS REFERENCE TO RELATED APPLICATIONS

This application claims the benefit of Provisional Application Ser. No. 62/005,307 entitled "SOLAR CELL WITH ABSORBER SUBSTRATE BONDED BETWEEN SUBSTRATES", filed on May 30, 2014, which is herein incorporated by reference in its entirety.

FIELD

Disclosed embodiments relate to solar cell and solar module fabrication, and solar cells and modules therefrom.

BACKGROUND

The commercial photovoltaic market is dominated by crystalline silicon wafer technology. However an increasing share of the market is shifting toward thin-film materials and/or a thin wafer format for crystalline materials including silicon because of anticipated cost reductions. The handling of such thin solar absorbing layers, whether amorphous or crystalline, involves the use substrates.

Conventional solar cell devices that rely on a thin solar absorbing material comprise on the sunny side an active layer, a passivation layer(s) on the active layer, an anti-reflective (AR) coating or a TCO electrode on the passivation layer(s), metal contacts on the anti-reflective coating or TCO, and an optically transparent (transparent) substrate (e.g., glass). The back side comprises the active layer on a bottom electrode, the active layer with an intermediate passivation layer on a bottom electrode, the active layer on a seed layer, or the active layer on a TCO and a transparent substrate. The TCO can comprise indium tin (ITO), aluminum doped zinc oxides (AZO), boron doped zinc oxide (BZO), fluoride doped tin oxide (FTO), or Fluorine doped Zinc Oxide (FZO), which are the most commonly used transparent conductor materials. Sunlight (photons) is received on the glass substrate side of the solar cell, and is transmitted through the TCO to the active layer which generally comprises silicon. The TCO can provide greater than 80% transmission over a wavelength range from about 250 nm to 1.1 μm.

Electron-hole pairs are generated in the active layer by incident photons having sufficient energy relative to the band gap energy from the sunlight. Individual solar cells, which generate a relatively low voltage (typically 0.5 to 0.6 volts), are combined in series to provide higher output voltages. The efficiency of silicon-based solar cells is known to be improved by thinning the active layer because of the resulting higher open-circuit voltage. Conventional silicon solar cells are currently limited to about 19% efficiency for multicrystalline silicon and 21% conversion efficiency for monocrystalline silicon. Silicon solar cells based on advanced architectures such as the interdigitated all back contact (IBC) solar cell currently achieve efficiencies around 24%.

Next generation passivated emitter and rear contact (PERC)/Selective Emitter solar cells are anticipated to improve the efficiency of conventional silicon solar cells from 20% to 22% efficiency while Heterojunction Intrinsic Thin Layer (HIT) (efficiency currently about 25%) and the IBC (efficiency currently 24%) cells are expected to improve and achieve efficiencies well beyond 25% in the future. The HIT solar cell comprises thin single crystalline silicon surrounded by ultra-thin amorphous silicon layers.

Conventional processing to form HIT solar cells begins with a clean crystalline silicon (c-Si) wafer surface prepared before the amorphous silicon (a-Si) deposition, which generally includes an HF dip for surface silicon oxide removal. Next, an intrinsic amorphous silicon (i-a-Si) layer (passivation layer) followed by a p-type amorphous silicon (p-a-Si) layer is deposited in a high vacuum on one side of the wafer to form the p/n heterojunction. The step is repeated for the back side of the wafer where an intrinsic amorphous silicon (i-a-Si) layer (passivation layer) is deposited followed by an n-type amorphous silicon n-a-Si layer to obtain a Back Surface Field (BSF) structure. Subsequently, TCO layers are formed on both sides and on top of the n/p amorphous layers, and finally, metal grid electrodes are formed also on both sides of the wafer using a screen-printing method.

The heterojunction solar cell includes an amorphous semiconductor deposited onto a crystalline semiconductor to create passivation and form a heterojunction. A typical heterojunction solar device (e.g. HIT cell) includes deposited intrinsic (passivation layer) and doped amorphous (a)-Si layers on top of a crystalline c-Si layer forming a heterojunction front emitter and a back surface field in the rear contact.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include methods of forming solar cells and solar modules which include a plurality of solar cells including double-sided bonding of at least one solar absorber material substrate (e.g., a silicon substrate/wafer) to a first and a second fully processed optically transparent (transparent) substrate, each generally including successive formation of a metal contact layer and/or a transparent conducting oxide (TCO) layer and/or a passivation layer, not necessarily in that order. Disclosed methods enable forming essentially any solar cell architecture, including, but are not limited to, Al- (Back Surface (BSF), passivated emitter rear cell (PERC), Passivated emitter rear locally diffused (PERL), heterojunction intrinsic thin layer (HIT), and inter-digitated back contacted (IBC) cell types. The double-sided bonding can comprise adhesiveless bonding. The double-sided bonding can also utilize an electrically conductive adhesive for the respective bonds.

As used herein, an adhesivelessly bonded interface resulting from disclosed double sided adhesiveless bonding refers to direct chemical bonding, without any intervening adhesive layer. Chemical bonding can generally be initiated when any two flat, clean and smooth surfaces are brought into physical contact based solely on physical forces such as the Vander Waals forces, capillary forces or electrostatic forces. An appropriate temperature, surface treatment, chemical treatment, atmospheric pressure, and/or applied force enables a strong chemical bond being formed and therefore formation of an adhesivelessly bonded interface.

Disclosed methods significantly enable the use of regular thickness (~180 μm) and thinner solar absorber material substrates such as single crystal silicon or GaAs wafers all the way down to <1 μm as there is essentially no thickness limitations for disclosed methods as long as the solar absorber material substrate (e.g., wafer) can be produced. Disclosed methods generally involve less processing steps (4 or 5 steps) as compared to known solar cell fabrication technologies and are independent of the architecture (generally 7 to 12 steps) while maintaining good mechanical yield since the solar absorber material wafer is never handled until the very last bonding step, during which the mechanical or thermal stress is relatively insignificant. The reduction of even one step in the solar cell fabrication process is known to reduce the fabrication cost significantly. Moving towards thinner wafers is also recognized as important for cost reduction and efficiency increases. For example, the thicknesses for the active/absorber layer for both conventional and advanced solar cells are expected to be below 100 μm in order to achieve efficiencies beyond 25%

Moreover, as noted above, there is also significant cost benefits from using disclosed double-side bonding methods since the number of processing steps are reduced compared to conventional and advanced processes for forming solar cells. Further cost reductions can also be achieved by fabricating entire modules based on essentially the same process using larger area transparent substrates having electrodes and performing double-sided bonding of multiple absorber material chips to such larger area transparent substrates as in FIG. 2A described below. Alternatively, FIG. 2B described below discloses individual sealed glass-on-glass solar cells fabricated using a disclosed double-sided bonding method directly mounted on a solar PV racking system analogous to mounted tiles. Such a modular design allows for easy maintenance and replacement of individual damaged or underperforming solar cells.

DETAILED DESCRIPTION

Figure 1A:
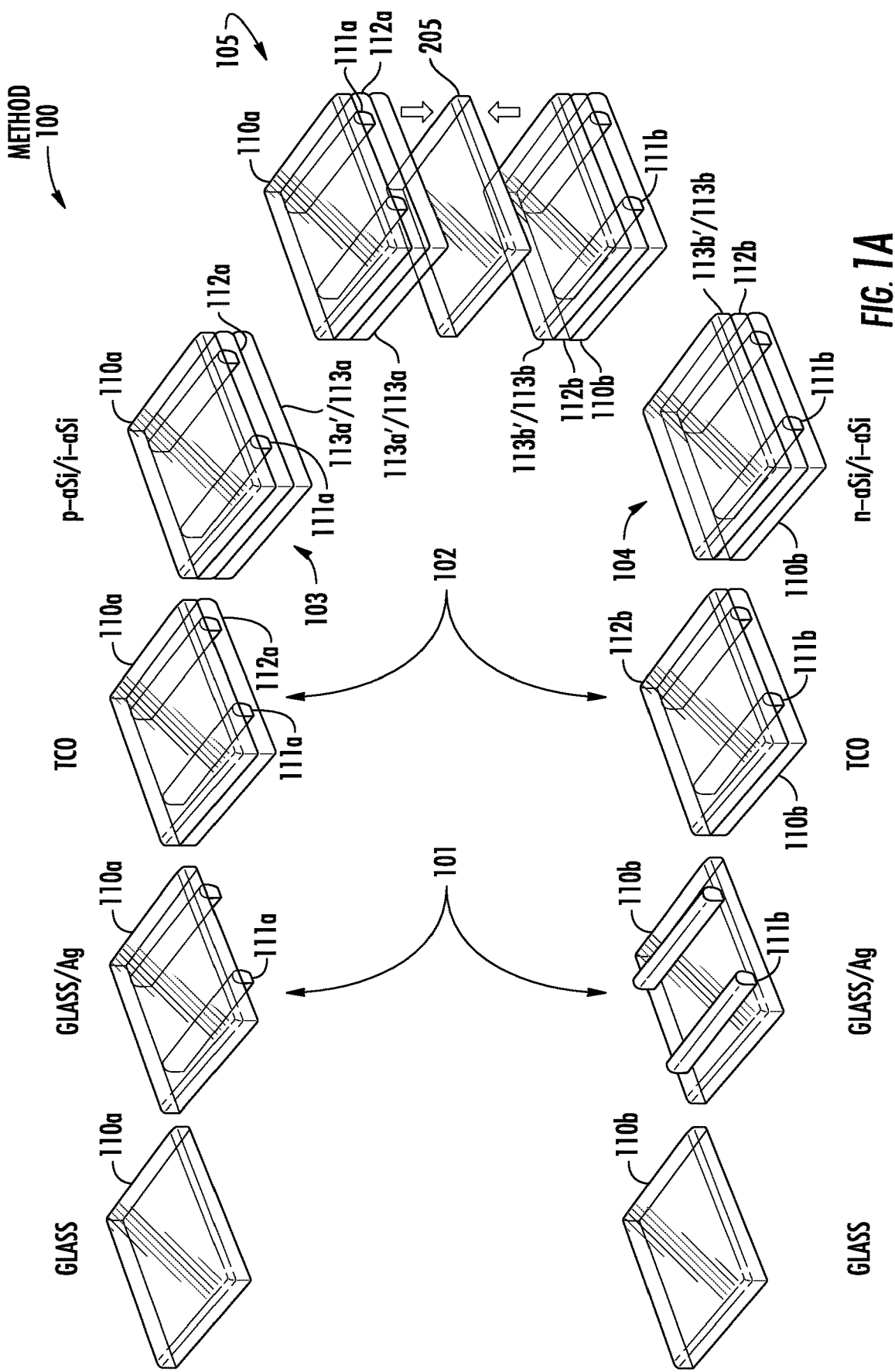
FIG. 1A depicts steps in an example process flow to form a HIT solar cell showing successive layer additions, according to an example embodiment.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein.

One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Instead of conventionally beginning with a solar absorber material substrate (e.g., wafer) such as a single crystal silicon wafer, and processing one side and then processing the other side of the wafer, disclosed methods use two essentially fully processed transparent substrates as the building blocks for a wide variety of solar cell types and essentially fabricate the solar cell in a reversed order relative to conventional fabrication flows. As noted above, disclosed methods are applicable to essentially any solar cell architecture/material that needs contact and/or TCO and/or passivation layers to be formed on the absorber layer and using such as bonding medium between the absorber layer and processed transparent substrates. In such cases, the contact and/or TCO and/or passivation layers can be similarly formed on the fully processed transparent substrates as building blocks before bonding them together with the absorbing layer substrate, which as described above can be essentially as thin as desired. Fabricating on the transparent substrate offers the advantage of minimum handling of a thin absorber substrate, including below 200 μm thick, down to 1 μm thick.

Disclosed embodiments include methods of forming a solar cell, including providing a first processed transparent substrate and a second processed transparent substrate, wherein at least one of the first processed substrate and the second processed substrate includes electrodes thereon. A solar absorber material substrate such as a silicon substrate (e.g., monocrystalline or multicrystalline wafer, epi-layer, etc.) or any other solar absorber material substrate having a first side and a second side is sandwiched between the first processed substrate and the second processed substrate. In a double-sided bonding step the solar absorber material substrate is bonded on both its sides to the first and second processed substrates. As noted above, further cost reductions can be realized by fabricating entire modules based on the double-sided bonding process using larger area transparent substrates having electrodes and performing double-sided bonding of multiple absorber material chips to such larger area transparent substrates.

In the case the solar absorber material substrate comprises silicon, the bonding process can comprise direct (adhesiveless) bonding of silicon-to-silicon referred to as direct hydrophobic bonding. The two flat, clean and smooth surfaces of the processed transparent substrates can be brought into contact with the silicon substrate using pressure plates to form a weak Si—Si bonding based on physical forces such as the Vander Waals forces, capillary forces or electrostatic forces. The bonded substrate can then be annealed at a relatively high temperature. Si—H—Si bonds are generally created between 150° C. and 300° C., Si—Si+$H_2$ occurs between 300° C. and 700° C. together with microvoids, Si—Si bond without microvoids can be achieved above 700° C. as silicon atoms diffuse and close them. This atomic interaction is recognized to adhesivelessly bond the interface together. Low temperature direct hydrophobic bonding of silicon to silicon down to room temperature (25° C.) has been successfully demonstrated and typically involves additional treatment of the silicon wafer surfaces such as plasma treatment, high-vacuum, chemical-mechanical polishing, chemical treatment, and/or amorphization (a-Si layer). Using a combination of such disclosed strategies, it was demonstrated that void free interfaces and a bonding strength close to 20 Mpa is achievable at room temperature.

Other adhesiveless bonding processes may also be used. For example, direct hydrophilic bonding (Si—O—Si or $SiO_2$—$SiO_2$) around 1100° C. Low-temperature direct hydrophilic bonding processes below 400° C. down to 25° C. have been successfully demonstrated and may or may not involve a high vacuum. The use of various intermediate layers for bonding such as a metal layer, a glass layer, a glass-frit layer, or others is also possible. Anodic bonding can be another adhesiveless bonding option which typically is used to bond silicon to glass and involves a DC bias applied across pressure plates. However, as noted above, the bonding can comprises applying a conductive adhesive.

FIG. 1A depicts steps in an example method 100 to form a HIT solar cell where the example absorber material substrate comprises a silicon substrate, showing successive layer additions, according to an example embodiment. A first and second optically transparent substrate shown as glass substrate 110a and glass substrate 110b receive respective electrodes 111a and 111b in step 101, such as using a conventional metal screen printing process to provide metal electrodes. The electrodes 111a and 111b are shown in FIG. 1A being silver (Ag), although other electrically conductive materials may also be used. In step 102, a TCO layer shown as 112a and 112b is blanket coated on respective transparent substrates 110a and 110b.

Step 103 comprises blanket coating a layer of doped amorphous silicon with a layer of p-doped silicon (p-doped silicon layer) 113a on glass substrate 110a and then a layer of intrinsic amorphous silicon 113a' on the p-doped silicon layer 113a. (shown as 113a'/113a). Step 104 comprises blanket coating a layer of n-doped silicon (n-doped silicon layer) 113b on the glass substrate 110b, then a layer of intrinsic amorphous silicon 113b' on the n-doped silicon layer 113b (shown as 113b'/113b).

Step 105 comprises sandwiching at least one absorber material substrate 205 between the two processed transparent substrates comprising glass substrates 110a and 110b as shown and performing an adhesiveless direct silicon-silicon bonding of the absorber material substrate 205 being a silicon substrate on one side to the intrinsic amorphous silicon layers 113a' and on its other side to the intrinsic amorphous silicon layer 113b'. Direct Si—Si bonding is recognized to be well understood and routinely used in the MEMS industry; however, this is not the case in the photovoltaic industry.

Further cost reductions can also be achieved by fabricating entire modules based on method 100 using larger area transparent substrates having electrodes and performing double-sided bonding of multiple absorber material chips to such larger area transparent substrates. Although FIG. 1A shows a single absorber material substrate 205 between the two processed transparent substrates comprising glass substrates 110a and 110b, as noted above a plurality of absorber material substrates 205 in die form can each be picked and placed and then simultaneously bonded to two processed larger area transparent substrates to form a solar module.

Figure 1B:
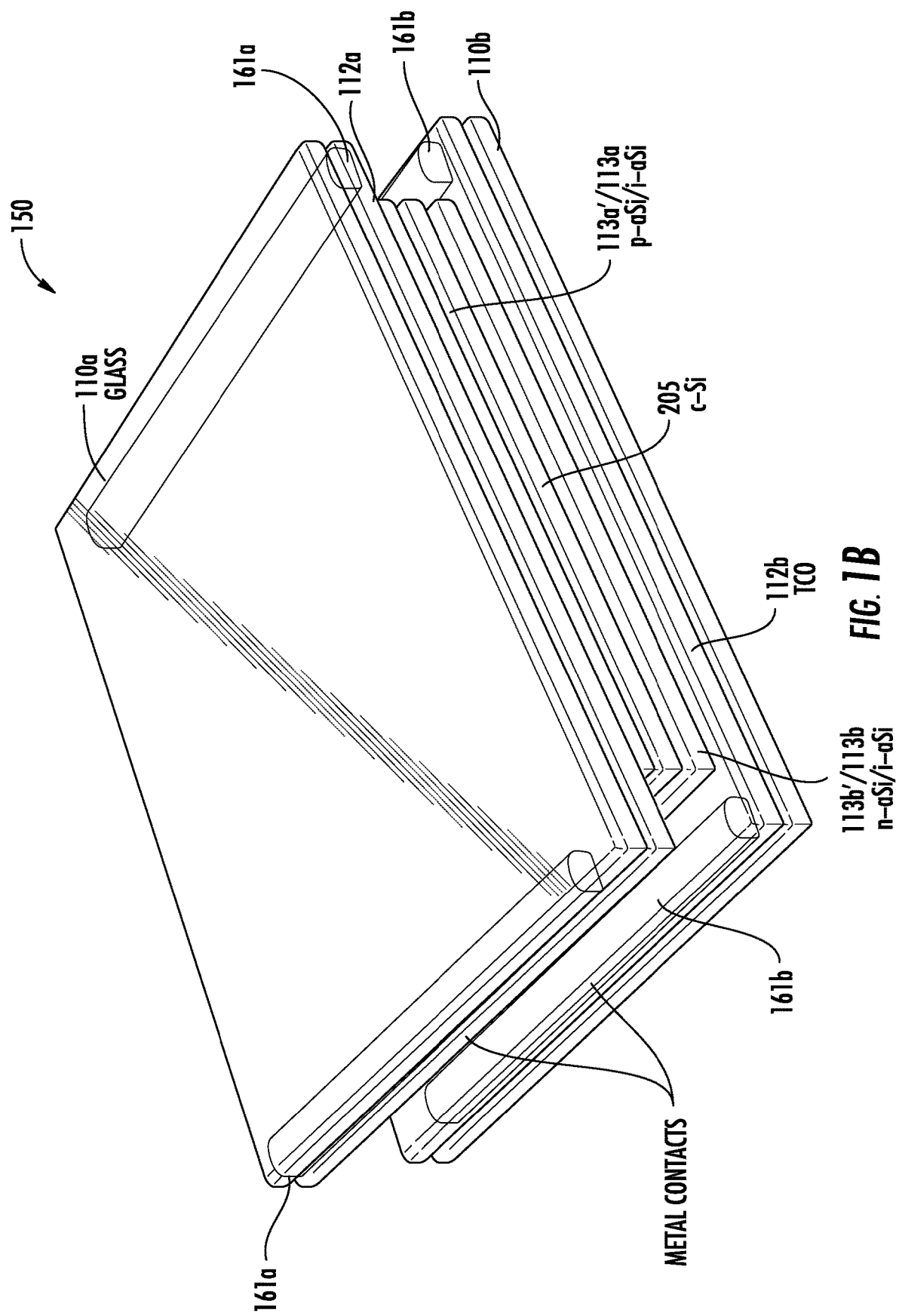
FIG. 1B shows the metal contact or electrode for a HIT solar cell at the opposing edges of the glass substrate and outside the bonded area for the purpose of interconnecting together solar cells.

FIG. 1B shows the metal contact or electrodes for a HIT solar cell 150 shown as 161a, 161b at the opposing edges of the glass substrates 110a, 110b, and outside the bonded area for the purpose of interconnecting together solar cells. It is noted that the number and configuration of the electrodes can vary greatly. Typically within a single cell, one would have only one electrode (e.g. 161a) at one side (top or bottom but not both) and only one (e.g. 161b) on the other side (top or bottom but not both). When the cells are connected in series (side by side), it is the equivalent of connecting 161a of one cell to 161b of the other cell. Electrodes 161a of one cell and 161b of the other cell could be both at the bottom or top, or one at the bottom and the other at the top. The goal is generally to minimize the use of metal and stress within the interconnect.

Figure 1C:
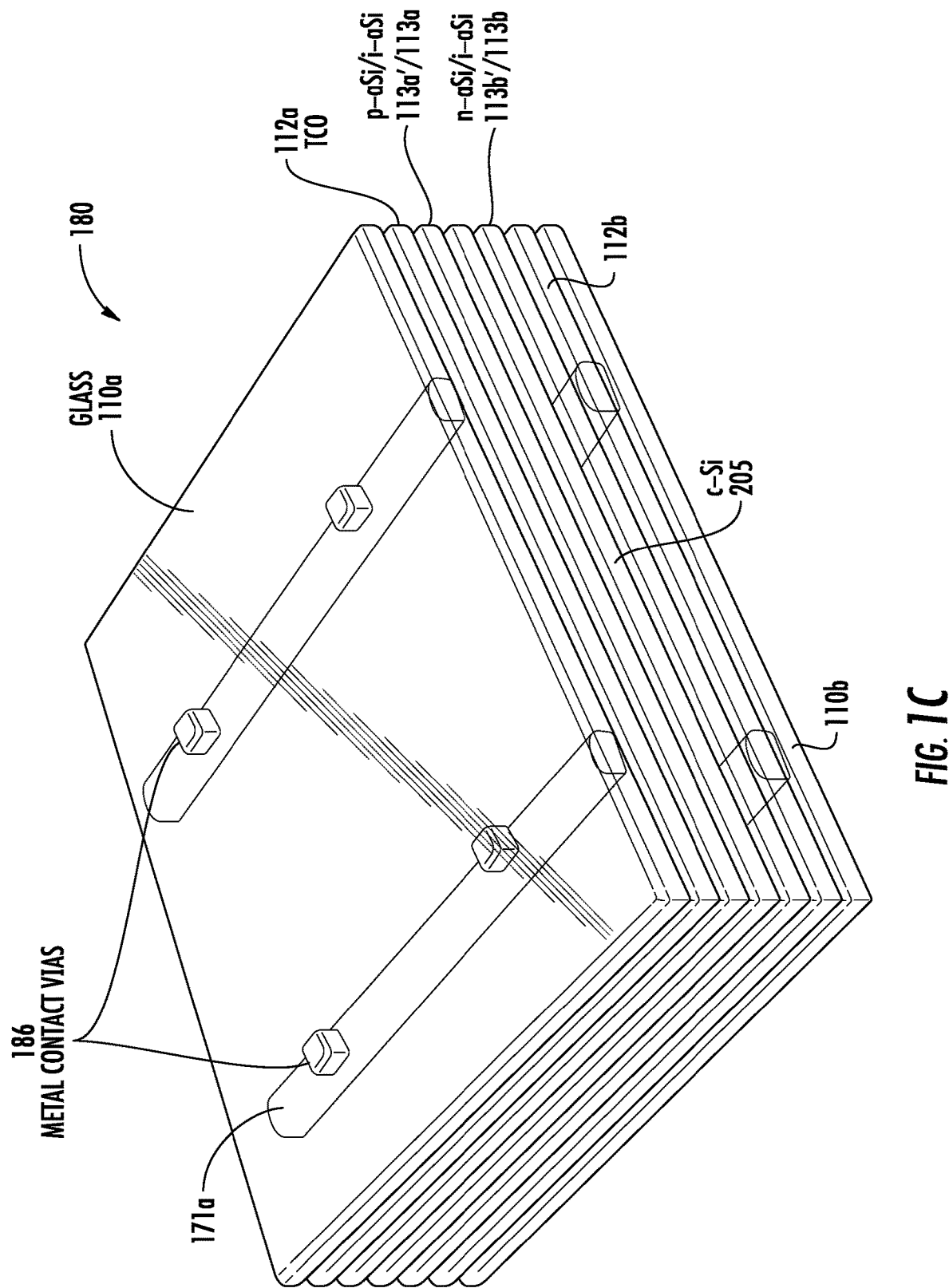
FIG. 1C shows the buried metal contact or electrode for a HIT solar cell yet flush with the surface of the glass substrate, located directly on top/bottom of the bonded area, and accessible for the purpose of interconnecting solar cells together through via holes.

FIG. 1C shows the buried metal contact or electrode for a HIT solar cell 180 flush with the surface of the glass substrates 110a, 110b, located directly on top/bottom of the bonded area, and accessible for the purpose of interconnecting solar cells together through via holes. The vias are metal filled contact vias 186 through the glass substrates 110a, 110b which contact the electrodes shown as contacting electrodes 171a.

Figure 1D:
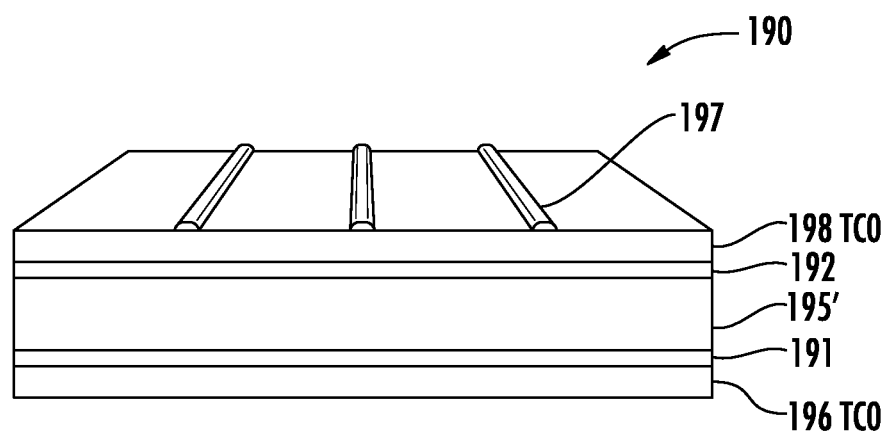
FIG. 1D shows a cross sectional depiction of example HIT solar cell, according to an example embodiment.

FIG. 1D shows a cross sectional depiction of example HIT solar cell 190, according to an example embodiment. The absorber material substrate 195' for the HIT cell 190 can be a crystalline silicon substrate. TCO layers are shown as 196 and 198. First and second doped layer on intrinsic amorphous silicon layer shown as 191 and 192, respectively, are adhesivelessly bonded on respective sides of the absorber material substrate 195'. Electrodes 197 are on the first and second doped layer on intrinsic amorphous silicon layers 191 and 192, respectively.

Figure 2A:
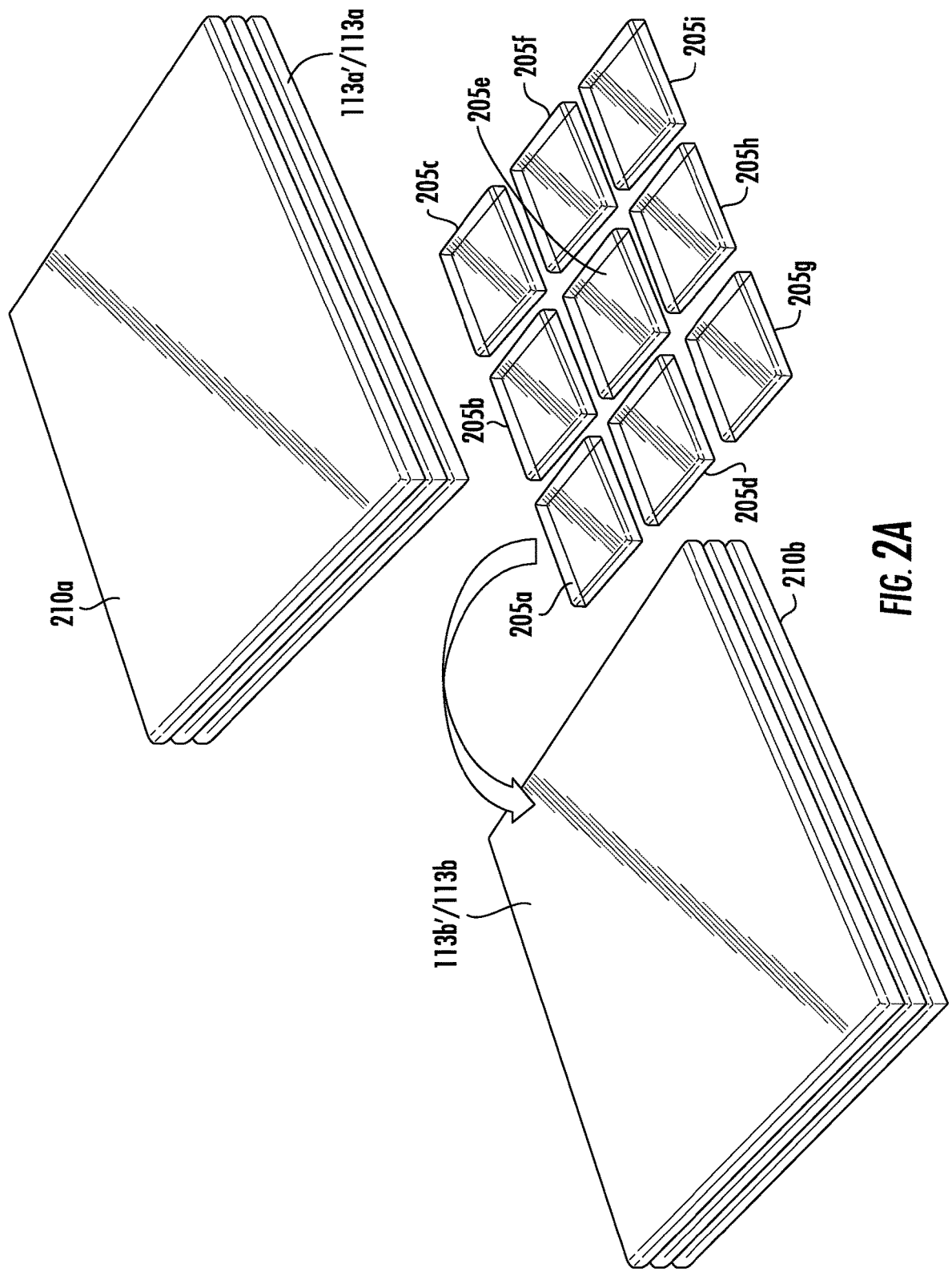
FIG. 2A depicts a double sided module-scale bonding process to fabricate a solar module including a plurality of solar cells using larger area transparent substrates having electrodes where multiple absorber material chips are simultaneously bonded between the larger area processed glass substrates, according to an example embodiment.

FIG. 2A depicts a double sided module-scale bonding process to fabricate a solar module including a plurality of solar cells using larger area processed transparent substrates 210a, 210b having electrodes where multiple absorber material chips shown as 205a-205i are simultaneously bonded between the larger area processed transparent substrates 210a, 210b, according to an example embodiment. In one particular embodiment the absorber material chips 205a-205i are 156 μm by 156 μm in area and are positioned between the processed larger area processed transparent substrates 210a, 210b before bonding using a pick and place apparatus to transfer the absorber material chips 205a-205i.

Figure 2B:
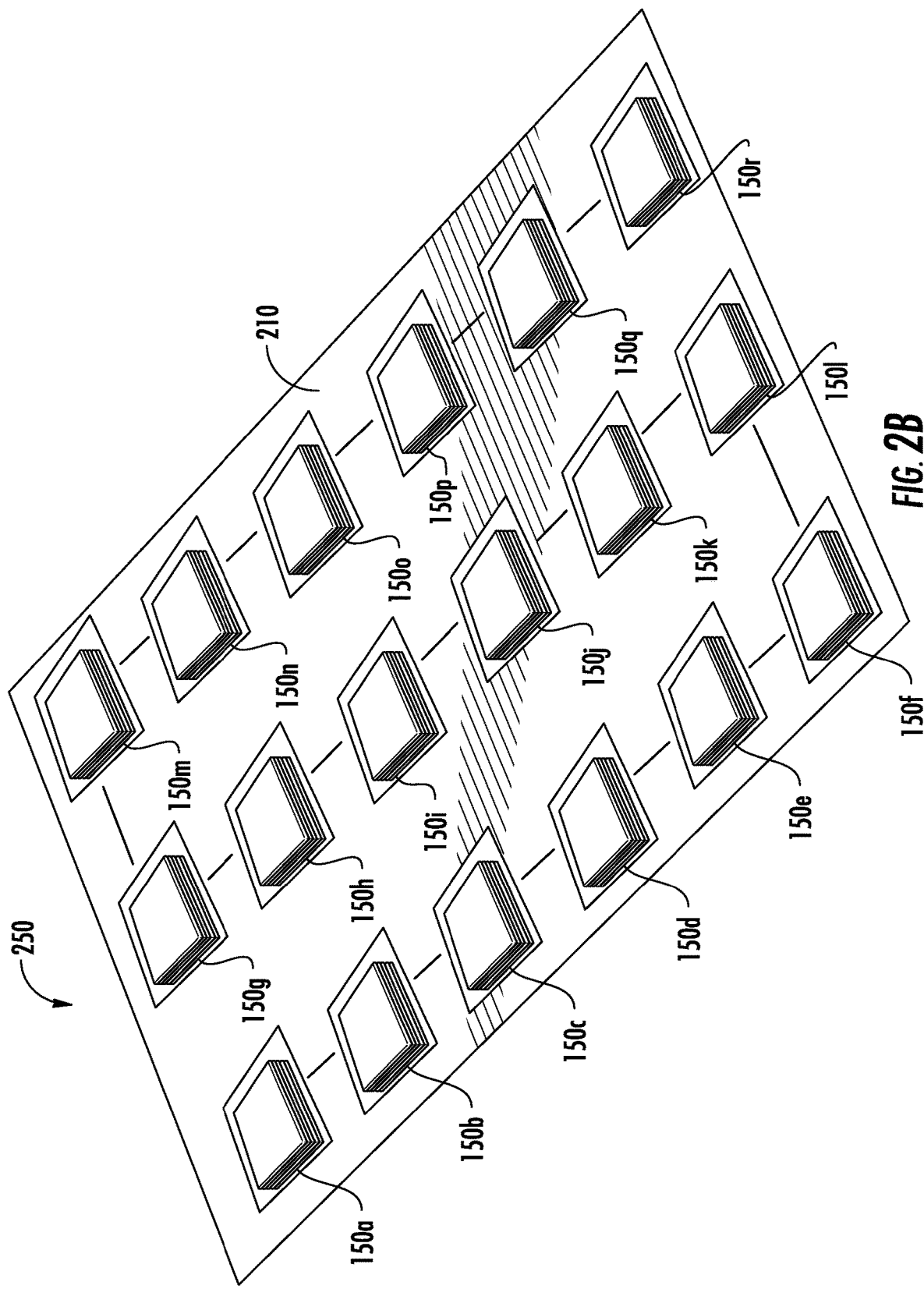
FIG. 2B depicts fully processed solar cells mounted directly onto the frame of a solar photovoltaic (PV) racking system in an arrangement analogous to tiles, according to an example embodiment.

FIG. 2B depicts a solar module 250 comprising fully processed solar cells shown as eighteen (18) of the HIT solar cell 150 in FIG. 1B shown as 150a-150r mounted directly onto an additional large area substrate comprising the frame 210 of a solar PV racking system in an arrangement analogous to tiles, according to an example embodiment. A "large area" means the additional substrate is larger in area relative to the area of the individual solar cells. It is noted that the frame 210 shown in FIG. 2B is different from the larger area processed transparent substrates 210a and 210b shown in FIG. 2A, which generally comprise glass. In the case of frame 210, it is similar to a window frame as it does not cover the cells, but rather the cells are mounted like pieces of glass onto the frame 210. Moreover, the frame 210 need not be transparent and can thus comprise metal (such as aluminum), carbon composite, or an injection-molded plastic racking system.

One embodiment may resemble a window with multiple square frames 210, one for each solar cell. Each cell can be mounted within its assigned frame using a quick mounting mechanism such as a series of latches, clips or clamps. The network of interconnect built within the frame would be in direct contact with the cell electrodes. Another embodiment may comprise a frameless injection molded plastic racking system structure having indentations allowing for the cells to be mounted directly on the racking system. Here too a network of interconnect can be implemented within the injection molded plastic structure to electrically connect cells mounted in the indented areas. Other embodiments are possible.

The lines shown between the HIT solar cells 150a-150r represents interconnect lines that serial connect cells. As noted above, disclosed double-sided bonding methods provide cost reductions as they enable thin wafer processing and a reduction in processing steps. Additionally, disclosed methods also lend themselves to low temperature (which can be as low as 25° C.) and atmospheric processing, which helps to increase throughput and therefore further reduce cost. Furthermore, as noted above significant cost reduction can be achieved through scaling by bonding a plurality of absorber material die on larger area processed transparent substrates, essentially fabricating the entire solar module directly from a plurality of absorber material die.

This approach also has the advantage of decoupling the wafering method for the absorber material substrate (e.g. slurry saw, diamond saw, implant-cleave, epi-layer growth, etc.) with the solar cell fabrication processing, which is difficult to perform with conventional epitaxial Si substrates for example. Another advantage is that the absorber material substrate may not need any texturization depending on the optical strategy used, which is recognized to aid disclosed adhesiveless bonding to optically transparent substrates since a flat surface is generally best. Optical structures for increased light collection/trapping can be produced within or adjacent (on either side) to the transparent substrate (e.g. glass), or the TCO, or the passivation layers (e.g., amorphous silicon).

Figure 3A:
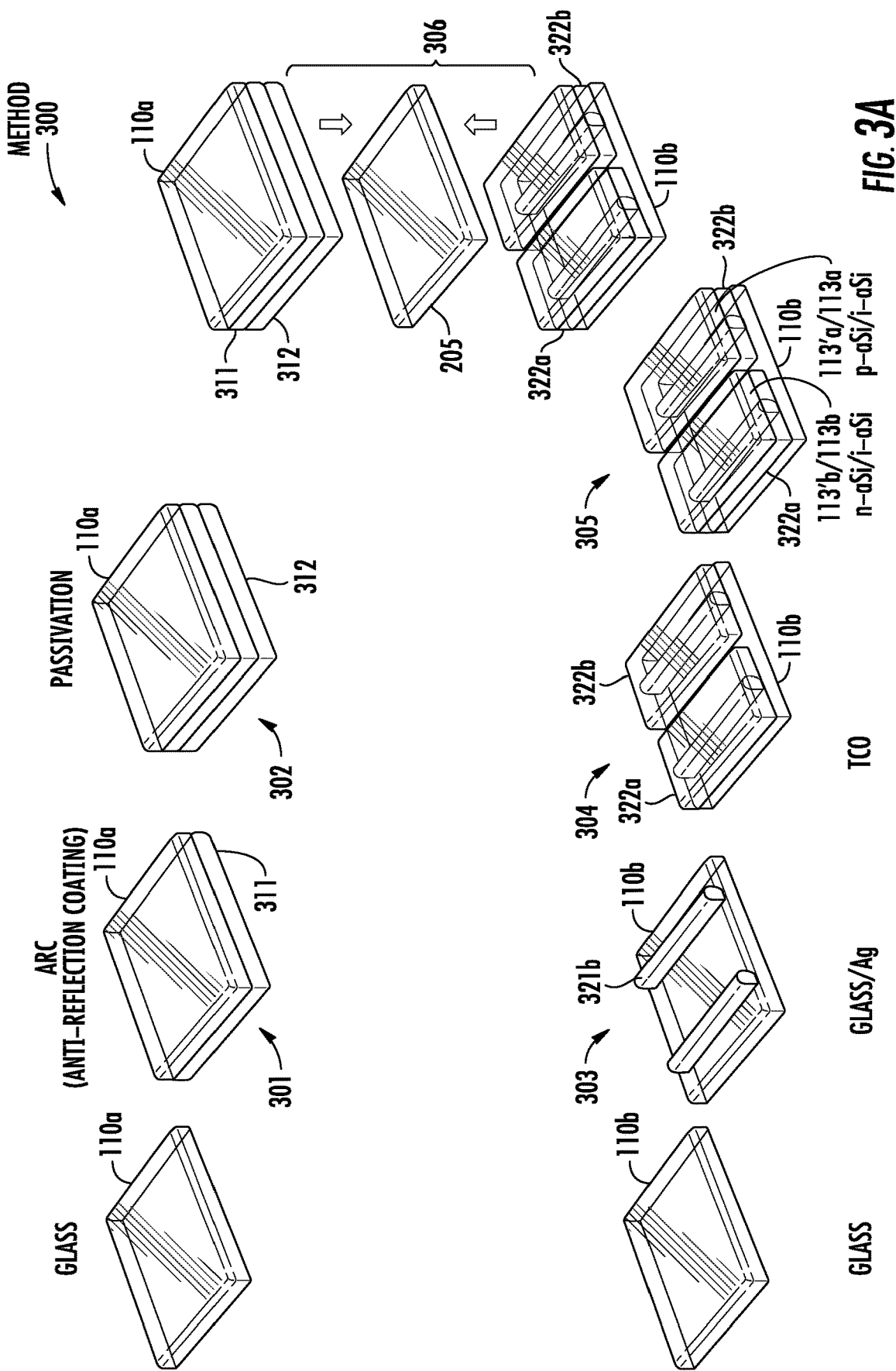
FIG. 3A depicts steps in an example process flow of a method for forming an IBC silicon heterojunction (IBC-SHJ) solar cell showing successive layer additions, according to an example embodiment.

FIG. 3A depicts steps in an example process flow of a method 300 for forming an IBC Silicon Heterojunction (IBC-SHJ) solar cell showing successive layer additions, according to an example embodiment. Step 301 comprises forming an AR coating 311 on a glass substrate 110a. Step 302 comprises coating a passivation layer 312 on the AR coating 311. Step 303 comprises forming electrodes 321b on the glass substrate 110b, and step 304 comprises forming TCO layers 322a and 322b on respective sides of the glass substrate 110b. Step 305 comprises coating a layer of intrinsic amorphous silicon 113a' on the p-doped silicon layer 113a. (shown as 113a'/113a) on TCO layer 322a and coating a layer of intrinsic amorphous silicon 113b' on the n-doped silicon layer 113b. (shown as 113b'/113b). Step 306 comprises double-sided bonding an absorber material substrate 205 on one side to the passivation layer 312 on the glass substrate 110a and on its other side the intrinsic amorphous silicon surfaces of 113a' and 113b' on glass substrate 110b.

Figure 3B:
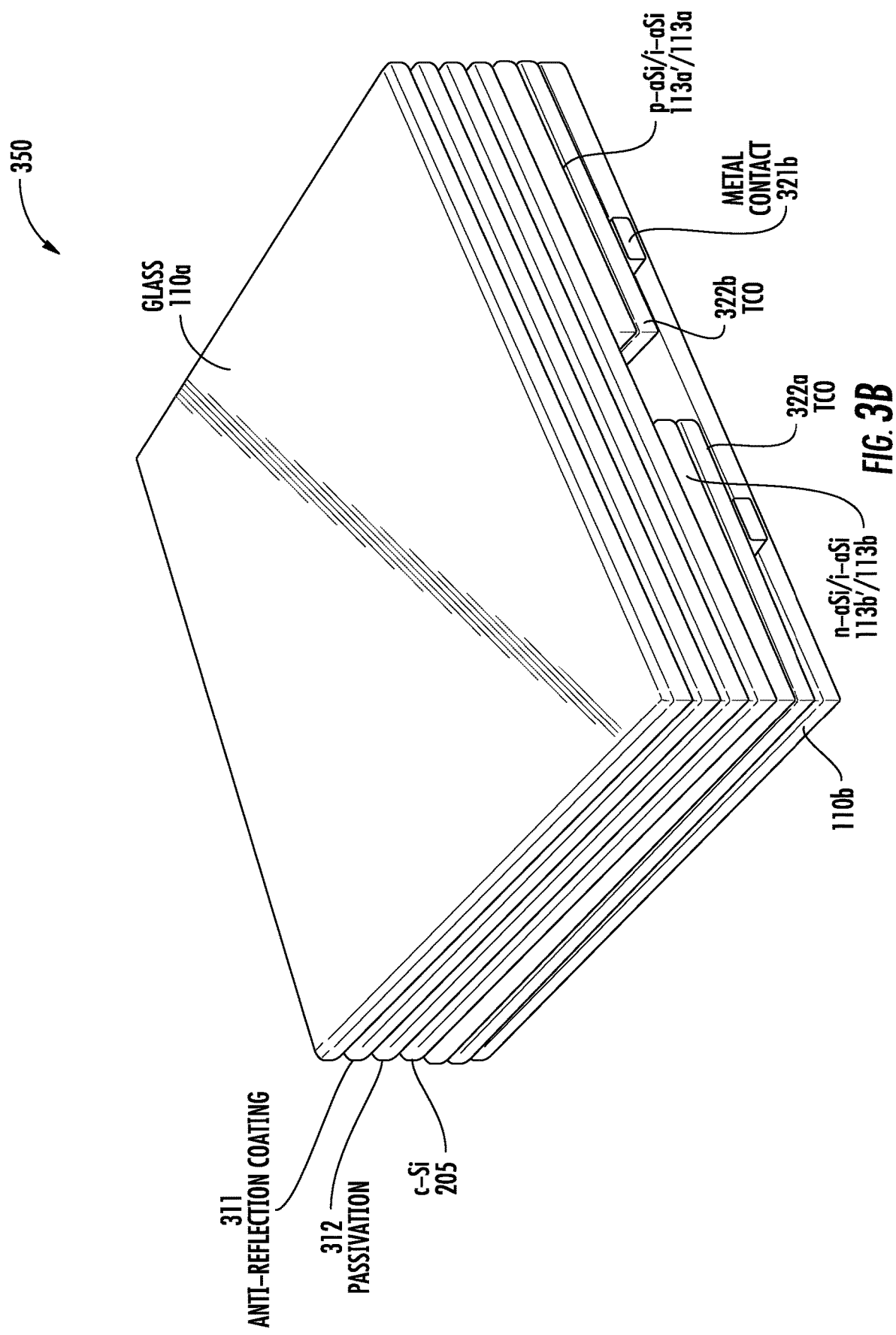
FIG. 3B shows a cross sectional depiction of example an IBC silicon heterojunction (IBC-SHJ) solar cell with buried back contacts, according to an example embodiment.
Figure 3C:
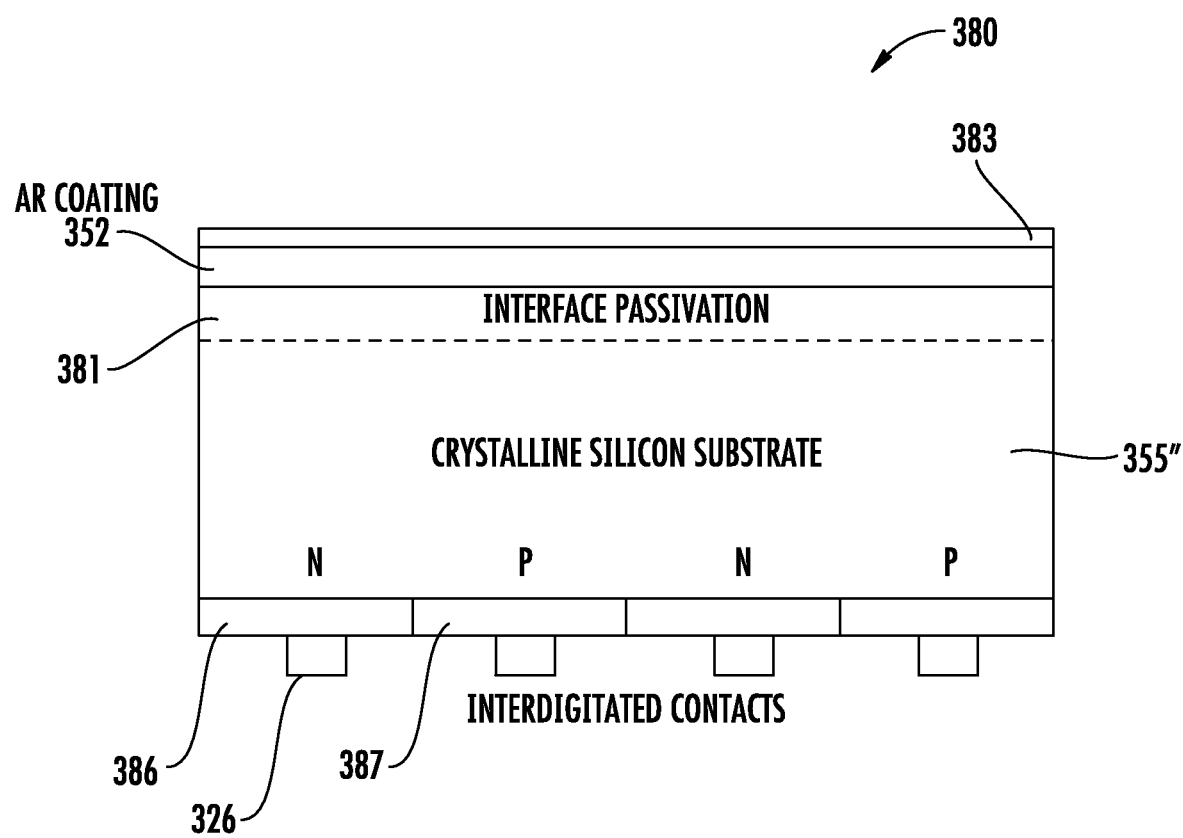
FIG. 3C shows a cross sectional depiction of example an all IBC silicon solar cell, according to an example embodiment.

FIG. 3B shows a cross sectional depiction of an example IBC Silicon Heterojunction (IBC-SHJ) solar cell 350 with electrodes 321b configured as buried back contacts being shown as "metal contacts", according to an example embodiment. FIG. 3C shows a cross sectional depiction of example all IBC solar cell 380, according to an example embodiment. IBC cell 380 includes absorber material substrate shown as a crystalline silicon substrate 355". On one side of the silicon substrate 355" is bonded n-doped regions 386 and p-doped regions 387 with interdigitated electrodes including fingers 326 on the n-doped and intrinsic amorphous silicon layers 386 and fingers 326 on the p-doped and intrinsic amorphous silicon layers 387. On the other side of the crystalline silicon substrate 355" is a bonded interface passivation 381 such as an oxide layer, an AR layer 352 shown as an "AR coating" is on the passivation layer 381, and an optically transparent (e.g., glass) layer 383 on the AR layer 352. IBC cell 380 having all its contacts on the back of the cell eliminates contact shading, leading to a higher short-circuit current (Jsc). With all the contacts on the back of the IBC solar cell 380, series resistance losses are reduced as the trade-off between series resistance and reflectance is avoided and contacts can be made significantly larger.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

Although disclosed embodiments have been illustrated and described with respect to one or more implementations, equivalent alterations and modifications will occur to others skilled in the art upon the reading and understanding of this specification and the annexed drawings. While a particular feature may have been disclosed with respect to only one of several implementations, such a feature may be combined with one or more other features of the other implementations as may be desired and advantageous for any given or particular application.

The invention claimed is:
1. A solar cell, comprising:
a first glass substrate;
at least a first electrode under said first glass substrate;
a first intrinsic silicon layer under said first electrode, on an opposite side of said first electrode relative to said first substrate;
a p-doped silicon layer on said first intrinsic silicon layer;
a second glass substrate;
at least a second electrode over the second glass substrate;

a second intrinsic silicon layer over said second electrode on an opposite side of said second electrode relative to said second glass substrate;

a n-doped silicon layer on said second intrinsic silicon layer; and at least one solar absorber material substrate having a first side and a second side, wherein said first side of said solar absorber material substrate is directly bonded to said first intrinsic silicon layer by a first direct adhesiveless bond forming a first adhesiveless bonded interface, and wherein said second side of said solar absorber material substrate is directly bonded to said second intrinsic silicon layer by a second direct adhesiveless bond forming a second adhesiveless bonded interface, where both said first and second direct adhesiveless bonds are achieved solely by physical forces.

2. The solar cell of claim 1, wherein said solar absorber material substrate comprises a crystalline silicon substrate.

3. The solar cell of claim 1, wherein said solar cell comprises a Heterojunction Intrinsic Thin Layer (HIT) solar cell.

4. The solar cell of claim 1, wherein said solar cell comprises an interdigitated all back contact (IBC) solar cell.

5. The solar cell of claim 1, wherein a thickness of said solar absorber material substrate is from 1 µm to 500 µm.

6. A solar module, comprising:

a first glass substrate;

at least a first electrode under said first glass substrate;

a first intrinsic silicon layer under said first electrode on an opposite side of said first electrode relative to said first glass substrate;

a p-doped silicon layer on said first intrinsic silicon layer;

a second glass substrate;

at least a second electrode over the second glass substrate;

a second intrinsic silicon layer over said second electrode, on an opposite side of said second electrode relative to said second glass substrate;

a n-doped silicon layer; and a plurality of solar absorber material substrates each having a first side and a second side directly bonded to said first and said second intrinsic silicon layer, respectively, by a direct adhesiveless bond to provide a plurality of solar cells hooked in series via said network of interconnecting electrodes, wherein the direct adhesiveless bond is achieved solely by physical forces.

7. The solar module of claim 6, wherein said solar absorber material substrate comprises a crystalline silicon substrate.

8. The solar module of claim 6, wherein said plurality of solar cells comprise a Heterojunction Intrinsic Thin Layer (HIT) solar cell.

9. The solar module of claim 6, wherein said plurality of solar cells comprise an interdigitated all back contact (IBC) solar cell.

10. The solar module of claim 6, wherein a thickness of said solar absorber material substrate is from 1 µm to 500 µm.

11. The solar cell of claim 1, wherein the physical forces comprise Vander Waals forces, capillary forces, or electrostatic forces.

* * * * *